United States Patent [19]

Zampini

[11] Patent Number: 5,679,766
[45] Date of Patent: Oct. 21, 1997

[54] PURIFICATION PROCESS OF NOVOLAR RESINS USING ACID TREATED CHELATING CATION EXCHANGE RESIN

[75] Inventor: Anthony Zampini, Westborough, Mass.

[73] Assignee: Shipley Company, L.L.C., Marlborough, Mass.

[21] Appl. No.: 163,895

[22] Filed: Dec. 7, 1993

[51] Int. Cl.[6] .................................................... C08F 6/08
[52] U.S. Cl. ................................................. 528/482; 568/810
[58] Field of Search ...................... 528/482; 568/810

[56] References Cited

U.S. PATENT DOCUMENTS

| | | | |
|---|---|---|---|
| 5,288,850 | 2/1994 | Matsumoto et al. | 528/482 |
| 5,300,628 | 4/1994 | Honda | 528/482 |
| 5,446,125 | 8/1995 | Honda et al. | 525/482 |
| 5,543,263 | 8/1996 | Rahman et al. | 528/482 |

FOREIGN PATENT DOCUMENTS

| | | |
|---|---|---|
| 1228560 | 9/1989 | Japan . |
| 5234876 | 9/1993 | Japan . |
| 5234877 | 9/1993 | Japan . |
| 9312152 | 12/1991 | WIPO . |

*Primary Examiner*—Thomas R. Weber
*Attorney, Agent, or Firm*—Robert L. Goldberg

[57] ABSTRACT

The invention is for a process of removal of dissolved cation contaminants from a resin solution. The process of the invention involves providing a chelating ion exchange resin modified by treatment with an acid and contact of said solution with said modified exchange resin for a time sufficient to remove ionic metal impurities. The invention is useful for removal of ionic contaminants from resin solutions used in the preparation of photoresists.

17 Claims, No Drawings

PURIFICATION PROCESS OF NOVOLAR RESINS USING ACID TREATED CHELATING CATION EXCHANGE RESIN

BACKGROUND OF THE INVENTION

1. Introduction

This invention relates to the preparation of polymers free of metal contaminants. More particularly, this invention relates to polymer preparation for compositions especially useful for the formation of integrated circuits.

2. Description of the Prior Art

In the manufacture of high resolution integrated circuits, it is known that many processing liquids come into contact with a bare wafer. These include photoresists and treatment chemicals such as organic liquids and aqueous solutions which contain acids, bases, oxidants, and other proprietary ingredients. At least 15 to 50 liquids of various compositions are used to clean wafers, prime surfaces, deposit resists or other polymers, develop, rinse, etch, and strip the resist. It is known that these solutions may be a source of contamination of the integrated circuit wafer that may interfere with its performance. Thus, the reduction or removal of insoluble and soluble contaminants from processing fluids used for the production of integrated circuits before or during use is basic insurance for prevention of damage to the integrated circuit.

Photoresist coating compositions are used extensively in integrated circuit manufacture. Such compositions typically comprise a light-sensitive component and a polymer binder dissolved in a solvent. Typical photoresist compositions are disclosed in U.S. Pat. Nos. 5,178,986; 5,212,046; 5,216,111; and 5,238,776, each incorporated herein by reference for disclosure of photoresist compositions, processing, and use.

It is known that photoresist coating compositions contain particulate and ionic contaminants. For example, it is known that solid gels or insolubles form in photoresists due to dark reactions. In addition, soluble impurities such as moisture, silicone oils, plasticizers, and metal ions may be present from the manufacture of the resist components and from the packaging containers or dispensing tanks. Trapped bubbles from point-of-use filtration or the shaking of a resist bottle prior to dispensing can lead to defects in resist coatings. Effective contaminant removal is essential to the manufacture of such devices.

Ultrafiltration of resist liquids has progressed and manufacturers of resist now supply resist materials filtered through 0.04 µM diameter absolute filters. However, methods for removal of particulates from treatment solutions are not effective for removal of dissolved contaminants from solution such as organic impurities and ionic species. These contaminants can be at least as damaging to an integrated circuit as particulate contamination.

Efforts to remove dissolved cationic and anionic contaminants from treatment solutions used to manufacture integrated circuits are known in the art. For example, one such method is disclosed in International Publication No. WO 93/12152, incorporated herein by reference, which is directed to removing metal ions such as sodium and iron from novolak resins during manufacture. The process comprises cation exchange treatment whereby a cation exchange resin is first washed with a mineral acid solution to reduce the level of total sodium and iron ions within the exchange resin to preferably less than 100 ppb, passing a formaldehyde reactant through the so treated cation exchange resin to decrease the sodium and iron ion content to less than 40 ppb, passing a phenolic compound through the cation exchange resin to decrease its sodium and iron ion content to less than 30 ppb, and then condensing the so, treated phenolic compound with formaldehyde in the presence of an acid catalyst to form the polymer.

A method for removal of dissolved ionic metals and non-metals from a photoresist is disclosed in published Japanese Patent Application No. 1228560 published Sep. 12, 1989, incorporated herein by reference. In accordance with the procedures of this patent, a photosensitive composition is passed through a mixed bed of a cation exchange resin and an anion exchange resin to simultaneously remove cation and anionic species from the photoresist solution.

The above described processes are suitable for the removal of mobile metal ions such as sodium and potassium from such solutions but are somewhat less effective in removing heavier metal ions such as iron and chromium.

SUMMARY OF THE INVENTION

In accordance with the invention, a process is provided whereby a polymer solution is treated to remove essentially all dissolved metals therefrom using chelating cation exchange resins. The process comprises providing a cation exchange resin having chelating groups on the resin and treating the polymer solution, or a solution of the reactants used to form the polymer, with a chelating cation exchange resin in the presence of a mineral or organic acid.

DESCRIPTION OF THE PREFERRED EMBODIMENTS

The process of the invention is applicable to any polymer used as a binder in a photoresist composition containing dissolved metallic contaminants.

Photoresists are well known and described in numerous publications including DeForest, *Photoresist Materials and Processes*, McGraw-Hill Book Company, New York, Chapter 2, 1975 and Moreau, *Semiconductor Lithography, Principles, Practices and Materials*, Plenum Press, New York, Chapters 2 and 4, 1988, incorporated herein by reference.

Suitable positive-working photoresists typically contain two components—a light-sensitive compound and a film-forming polymeric binder where the light-sensitive component undergoes photochemical alteration upon exposure. Single component systems are known and typically comprise a polymer that undergoes chain scission upon exposure. The light-sensitive compounds most frequently used in two-component resist systems are esters formed from o-quinone diazide sulfonic acids, especially sulfonic acid esters of naphthoquinone diazides. These esters are well known and described by DeForest, supra, pages 47–55 and by Moreau, supra, pages 34–52. The light-sensitive compounds and the methods used to make the same are all documented in prior patents including U.S. Pat. Nos. 3,046, 110; 3,046,112; 3,046,119; 3,046,121; 3,106,465; 4,596, 763; and 4,588,670, all incorporated herein by reference.

The polymer binders most frequently used for positive-working photoresists in conjunction with o-quinone diazides are the alkali soluble phenol formaldehyde resins known as the novolak resins. Photoresists using such polymers are illustrated in U.S. Pat. Nos. 4,377,631; 4,404,272; 5,130, 410; 5,216,111; and 5,266,440. Another class of binders used with o-quinone diazides are homopolymers and copolymers of vinyl phenol. Photoresists of this nature are disclosed in U.S. Pat. No. 3,869,292. The process of the subject invention is especially useful for the purification of the phenolic polymers used to formulate positive-working photoresists.

Negative-working resists and the components thereof may also be treated in accordance with the invention and are well known in the art. Such photoresists typically undergo random crosslinking upon exposure to activating radiation thereby forming areas of differential solubility. Such resists often comprise a polymer and a photoinitiator. One class of negative-working resists comprises, for example, polyvinyl cinnamates as disclosed by R. F. Kelly, *Proc. Second Kodak Semin. Micro Miniaturization*, Kodak Publication P-89, 1966, p. 31. Other negative-acting resists include polyvinyl cinnamate acetates as disclosed in U.S. Pat. No. 2,716,102; azide cyclized rubber as disclosed in U.S. Pat. No. 2,940,853; polymethylmethacrylate/tetraacrylate as disclosed in U.S. Pat. No. 3,149,975; polyimide-methyl methacrylate as disclosed in U.S. Pat. No. 4,180,404; and polyvinyl phenol azide as disclosed in U.S. Pat. No. 4,148,655.

Another class of photoresists for purposes of the invention are those positive and negative acid-hardening resists disclosed in EPO application Ser. No. 0 232 972 in the name of Feely et al. These photoresists comprise an acid-hardening resin and a halogenated, organic, photoacid generating compound.

Substantially all resins used to prepare a photoresist composition are a potential source of dissolved metallic contaminants that can deleteriously effect performance of an integrated circuit. Typical dissolved metal contaminants include sodium, potassium, iron, copper, chromium, nickel, molybdenum, and zinc. While it is known to treat photoresist solutions and solutions of photoresist components with exchange resins to remove dissolved metals, it is also known that conventional ion exchange processes for removal of such contaminants are not suitable for reduction in the concentration of the metallic contaminants to the extent necessary for the manufacture of integrated circuits—i.e. to amounts less than 200 parts per billion parts of solution (ppb) and preferably to levels of less than 100 ppb.

The process of the invention comprises provision of a chelating cation exchange resin capable of chelating with metallic ions and contact of a solution of the polymer to be purified, or the reactants used to form the polymer, with said ion exchange resin in the presence of an organic or mineral acid. Contact may be by slurrying the components used to form the polymer either prior to or during the polymerization reaction, or a solution of the polymer, with the exchange resin or by passage of a solution of the polymer through a column of the exchange resin.

Chelating cation exchange resins are known and described in numerous publications. For example, suitable exchange materials are disclosed by Samuelson, *Ion Exchange Separation in Analytical Chemistry*, John Wiley and Sons, New York, 1963, pp 33, 69, 87, and 88, and in the Meyers, *Encyclopedia of Physical Science and Technology*, Second Edition, Harcourt Brace Jovanovich, San Diego, 1992, Volume 3, pp 363 to 367, each incorporated herein by reference. Typical chelating exchange resins are polyamines on polystyrene, polyacrylic acid and polethyleneimine backbones, thiourea on polystryrene backbones, quanidine on polystryrene backbones, dithiocarbamate on a polyethyleneimine backbone, hydroxamic acid on a polyacrylate backbone. mercapto on polystyrene backbones, and cyclic polyamines on polyaddition and polycondensation resins. Preferred chelating exchange resins for purposes of this invention are styrene-divinylbenzene copolymers having iminodiacetate groups where two carboxyl groups and the tertiary nitrogen give the resin a chelating capability. Such resins are commercially available as Dow Chelex 100 and Dowex A-1 both available from Dow Chemical Company, Diaion CR-10 available from Mitsubishi, Unicellex UR-10 available from Unitica Chemical, Lewatit TP-207 available from Bayer Corporation and as Amberlite IRC-718 from Rohm and Haas Company.

The chelating cation exchange resins are typically available in the form of a sodium salt. The sodium ions cannot be permitted to enter the solution of the polymer to be purified as a consequence of contact with the exchange material. It is believed that washing the exchange resin with the acid prevents sodium ions from entering the solution of the polymer by exchange of the sodium ion for the proton of the acid. In addition, it has been unexpectedly found that metal ion removal is significantly improved under acidic conditions, i.e., when the pH of the mixture varies from about 1 to 6.8. Suitable mineral acids include hydrochloric acid and sulfuric acid. Suitable organic acids include formic acid, acetic acid, propionic acid, butyric acid, oxalic acid, succinic acid, etc.

Prior to use, the chelating ion exchange resin is desirably treated by rinsing with an aqueous solution of any of the above acids. The solution used to rinse the exchange resin may contain an acid in a concentration of from 1 to 25 percent by weight and more preferably in a concentration of from 2 to 10 percent by weight. Treatment conditions are not critical and it is sufficient to pass the treatment solution through a bed of the exchange material in a column or to slurry the treatment solution with the exchange resin. Contact time between exchange material with the treatment solution may vary between about 5 minutes and 5 hours. Thereafter, the so modified ion exchange resin is washed with water until a pH of about 7.0 to 7.8 is reached. Finally, the treated resin is preferably dehydrated by washing the resin with an aqueous miscible organic solvent such as ethyl lactate or acetone and more preferably, a solvent that is the same solvent used as the solvent used to contain the polymer to be purified.

In accordance with the invention, contaminants may be removed from a polymer solution by treatment of a solution of the reactants prior to polymerization, the reaction mixture during polymerization, or the polymer in its reaction mixture following polymerization. The exchange reaction may be performed at room or elevated temperature though elevated temperatures result in increased exchange efficiency, but with possible concomitant degradation of temperature-sensitive materials. A preferred reaction temperature is from about 50° to 60° C.

The solution from which metal ions are to be removed may be treated with the ion exchange resins by slurrying the same with the solution or by passing the solution through a column of the exchange resin. The rate of passage of the solution through the column may vary between about 2 and 20 bed volumes per hour. Ambient conditions are suitable.

EXAMPLE 1

A mixture of 97.33 grams of m-cresol, 56.64 grams of benzaldehyde, 44.73 grams of salicylaldehyde, 0.5 liters of ethanol and 0.05 liters of concentrated hydrochloric acid was charged into a 1 liter 3-necked round bottom flask equipped with a mechanical stirrer, heating mantle, reflux condenser, and a nitrogen inlet tube. The mixture was heated to and kept at reflux for about 23 hours. The reaction mixture was transferred to an addition funnel and slowly added into 3 liters of deionized water to precipitate the product. After a 1 hour soak the precipitate was collected on a Bucknet funnel aided by reduced pressure. The product was rinsed, reslurried into 3 liters of deionized water and after a 2 hour soak was again collected on the Buckner filter and rinsed. The resin was partially air dried to remove the bulk of the water and further dried under vacuum at 65°–68° C. The yield was about 180 grams of powder having a glass transition temperature of about 165° C. and a weight average molecular of about 1980 Daltons. Trace metal analysis by Graphite Furnace AA Spectroscopy gave the following results: Na 760 ppb; K 40 ppb; Fe 515 ppb; Ca 240 ppb; Cu 20 ppb; Mg 70 ppb; Al 100 ppb; Pb<20 ppb; Cr 40 ppb; Ni<20 ppb; Zn<200 ppb and Mn<200 ppb.

EXAMPLE 2

To a 0.150 liter beaker was added 15 grams of AMBER-LITE® IRC-718 ion exchange resin (a product of Rohm & Haas Co.) and 0.05 liters of 10% hydrochloric acid. The resin was slurried in the acid solution and allowed to exchange for ten minutes. The acid solution was decanted and replaced with 0.05 liters of fresh 10% hydrochloric acid. After the resin was slurried, soaked and the acid solution decanted the process was repeated one more time. The ion exchange resin was then washed twice with 0.05 liter portions of deionized water and twice with 0.05 liter portions of ethanol. The ion exchange resin was now ready for use.

EXAMPLE 3

A mixture of 97.33 grams of m-cresol, 56.64 grams of benzaldehyde, 44.73 grams of salicylaldehyde, 0.5 liters of ethanol, and 0.05 liters of concentrated hydrochloric acid were charged into a 1 liter 3-necked round bottom flask equipped with a mechanical stirrer, heating mantle, reflux condenser, thermometer, and a nitrogen inlet tube. The mixture was heated to and kept at reflux for about 23.5 hours. The heating mantle was removed and the reaction mixture cooled to about 54° C. To this solution was added the treated ion exchange resin of Example 2 and the slurry stirred at about 45° C. for about 22 hours. The ion exchange resin was then separated from the product solution using a Buckner funnel under reduced pressure. The filtrate was transferred to a separatory funnel and then slowly added with stirring to 3 liters of deionized water. After a 2 hour soak the precipitate was collected and reslurried into 3 liters of deionized water. After standing in water for 2 hours the product was again collected on the Buckner filter and rinsed. The resin was air dried at about 65°–68° C. under vacuum. The yield was about 174 grams of powder having a glass transition temperature of about 165° C. and a weight average molecular of about 2070 Daltons. Trace metal analysis by Graphite Furnace AA Spectroscopy gave the following results: Na 200 ppb; K 40 ppb; Fe 60 ppb; Ca 120 ppb; Cu<20 ppb; Mg<20 ppb; Al 90 ppb; Pb<20 ppb; Cr<20 ppb; Ni<20 ppb; Zn 400 ppb and Mn<20 ppb.

I claim:

1. A method for providing a polymer having a low metal ion content, said process comprising the steps of contacting a solution of a polymer having a pH varying between about 1.0 and 6.8 with a chelating cation exchange resin which has been prepared by washing the same with an acid, the contact between the solution and chelating cation exchange resin being for a time sufficient to reduce the concentration of dissolved metals in solution.

2. The process of claim 1 where the acid used to wash the chelating cation exchange resin is a member selected from the group consisting of hydrochloric acid, formic acid, acetic acid, carbonic acid, propionic acid, butyric acid, malonic acid, succinic acid, citric acid, and lactic acid.

3. The process of claim 2 where the acid is hydrochloric acid.

4. The process of claim 2 where the acid is acetic acid.

5. The process of claim 1 where the polymer is a novolak polymer.

6. The process of claim 5 where the novolak resin is an aromatic novolak resin.

7. A process for removing dissolved metals from a solution of a novolak resin, said process comprising contact of an acidic solution of the novolak resin having a pH varying between about 1.0 and 6.8 with a chelating cation exchange resin which has been prepared by washing the same with an acid, the contact between the solution of the novolak resin and the chelating cation exchange resin being for a time sufficient to reduce the concentration of dissolved metals in solution.

8. The process of claim 7 where the novolak resin is an aromatic novolak resin.

9. The process of claim 8 where one of the constituents used to form the aromatic novolak is a bis-hydroxymethyl phenol.

10. The process of claim 8 where the constituents used to form the aromatic novolak comprise cresols and a bis-hydroxymethyl phenol.

11. The process of claim 7 where the acid used to wash the chelating cation exchange resin is a member selected from the group consisting of hydrochloric acid, formic acid, acetic acid, carbonic acid, propionic acid, butyric acid, malonic acid, succinic acid, citric acid, and lactic acid.

12. The process of claim 11 where the acid is hydrochloric acid.

13. The process of claim 11 where the acid is acetic acid.

14. The process of claim 7 where the chelating cation exchange resin is a styrene-divinylbenzene copolymer having iminodiacetate groups.

15. A method for providing a phenolic monomer suitable for formation of a phenolic polymer having a low metal ion content, said process comprising the steps of contacting a solution of said phenolic monomer having a pH varying between about 1.0 and 6.8 with a chelating cation exchange resin which has been prepared by washing the same with an acid, the contact between the solution and chelating cation exchange resin being for a time sufficient to reduce the concentration of dissolved metals in solution.

16. The process of claim 15 where the acid used to wash the chelating cation exchange resin is a member selected from the group consisting of hydrochloric acid, formic acid, acetic acid, carbonic acid, proprionic acid, butyric acid, malonic acid, succinic acid, citric acid and lactic acid.

17. The process of claim 16 where the acid is acetic acid.

* * * * *